(12) United States Patent
Chiang et al.

(10) Patent No.: US 10,249,562 B2
(45) Date of Patent: Apr. 2, 2019

(54) PACKAGE STRUCTURE AND FABRICATION METHOD THEREOF

(71) Applicant: Siliconware Precision Industries Co., Ltd., Taichung (TW)

(72) Inventors: Ching-Wen Chiang, Taichung (TW); Kuang-Hsin Chen, Taichung (TW); Hsien-Wen Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 278 days.

(21) Appl. No.: 14/610,910

(22) Filed: Jan. 30, 2015

(65) Prior Publication Data

US 2016/0066427 A1 Mar. 3, 2016

(30) Foreign Application Priority Data

Sep. 3, 2014 (TW) .............................. 103130350 A (51) Int. Cl.
*H05K 1/18* (2006.01)
*H01L 23/498* (2006.01)
*H01L 23/31* (2006.01)
*H01L 23/00* (2006.01)
(Continued)

(52) U.S. Cl.
CPC .... *H01L 23/49827* (2013.01); *H01L 21/6835* (2013.01); *H01L 23/3128* (2013.01); *H01L 23/5389* (2013.01); *H01L 24/19* (2013.01); *H01L 24/20* (2013.01); *H01L 2221/6834* (2013.01); *H01L 2221/68327* (2013.01); *H01L 2221/68368* (2013.01); *H01L 2221/68372* (2013.01); *H01L 2224/0401* (2013.01); *H01L 2224/04105* (2013.01); *H01L 2224/0557* (2013.01); *H01L 2224/06181* (2013.01); (Continued)

(58) Field of Classification Search
CPC ......... H01L 21/486; H01L 2224/16225; H01L 2224/18; H01L 23/3128; H01L 23/49811; H01L 23/49822; H01L 23/49827
See application file for complete search history.

(56) References Cited

U.S. PATENT DOCUMENTS 9,406,602 B2 * 8/2016 Kurita ................. H01L 21/6835
2007/0126122 A1 * 6/2007 Bauer ................. H01L 21/6835
257/774

(Continued)

FOREIGN PATENT DOCUMENTS

KR WO2013176426 * 11/2013

*Primary Examiner* — Yuriy Semenenko
(74) *Attorney, Agent, or Firm* — Mintz Levin Cohn Ferris Glovsky and Popeo, P.C.; Peter F. Corless; Steven M. Jensen (57) ABSTRACT

A method for fabricating a package structure is provided, which includes the steps of: providing a carrier having a recess; disposing an electronic element in the recess of the carrier; forming an insulating layer in the recess to encapsulate the electronic element; forming a circuit structure on the carrier, wherein the circuit structure is electrically connected to the electronic element; forming a plurality of through holes penetrating the carrier; and forming a conductive material in the through holes to form a plurality of conductors, wherein the conductors are electrically connected to the circuit structure. By using the carrier as a substrate body, the present invention avoids warping of the package structure.

20 Claims, 6 Drawing Sheets

(51) Int. Cl.
*H01L 21/683* (2006.01)
*H01L 23/538* (2006.01)

(52) U.S. Cl.
CPC ............ *H01L 2224/12105* (2013.01); *H01L 2224/16145* (2013.01); *H01L 2224/16227* (2013.01); *H01L 2224/24137* (2013.01); *H01L 2224/24195* (2013.01); *H01L 2224/32145* (2013.01); *H01L 2224/32225* (2013.01); *H01L 2224/73259* (2013.01); *H01L 2224/73267* (2013.01); *H01L 2224/94* (2013.01); *H01L 2224/97* (2013.01); *H01L 2924/157* (2013.01); *H01L 2924/15153* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 2008/0136002 A1* | 6/2008 | Yang | H01L 24/82 257/686 |
| 2008/0186690 A1* | 8/2008 | Miettinen | H01L 23/50 361/761 |
| 2011/0194265 A1* | 8/2011 | Su | H01L 23/49827 361/761 |
| 2014/0252540 A1* | 9/2014 | Bakalski | H01L 24/97 257/531 |
| 2015/0187742 A1* | 7/2015 | Kwon | H01L 24/82 257/774 |
| 2015/0262909 A1* | 9/2015 | Chen | H01L 21/6835 257/774 |

* cited by examiner

PACKAGE STRUCTURE AND FABRICATION METHOD THEREOF

CROSS-REFERENCES TO RELATED APPLICATIONS

This application claims under 35 U.S.C. § 119(a) the benefit of Taiwanese Application No. 103130350, filed Sep. 3, 2014, the entire contents of which are incorporated herein by reference.

BACKGROUND OF THE INVENTION

1. Field of the Invention

The present invention relates to package structures, and more particularly, to a package structure having at least an electronic element and a fabrication method thereof.

2. Description of Related Art

Along with the progress of electronic industries, electronic products are developed toward the trend of miniaturization and multi-function. Accordingly, various package types have been developed. To meet the demands of semiconductor devices for high integration, miniaturization and high electrical performance, package on package (PoP) technologies are continuously improved and 3D IC stacking technologies are developed.

FIGS. 1A to 1G are schematic cross-sectional views showing a method for fabricating a package structure 1 according to the prior art.

Figure 1A:
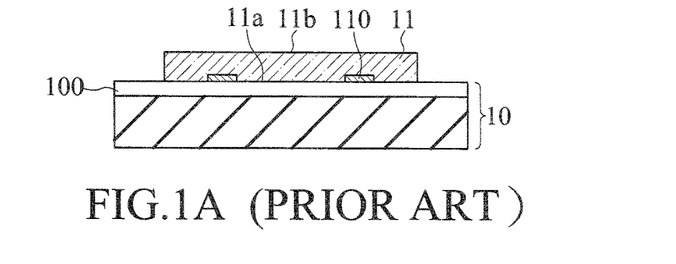
FIGS. 1A to 1G are schematic cross-sectional views showing a method for fabricating a package structure according to the prior art.

Referring to FIG. 1A, a first carrier 10 and a chip 11 are provided. The first carrier 10 has a release layer 100. The chip 11 has an active surface 11a with a plurality of electrode pads 110 and an inactive surface 11b opposite to the active surface 11a. The semiconductor chip 11 is disposed on the release layer 100 of the first carrier 10 through the active surface 11a thereof.

Figure 1B:
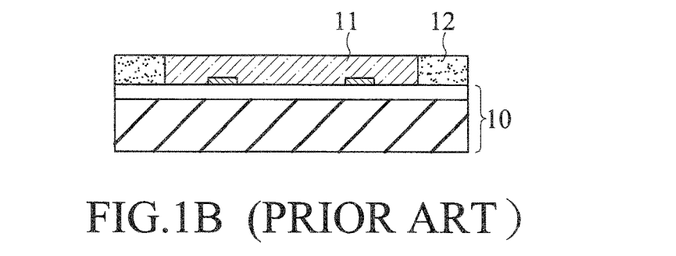

Referring to FIG. 1B, by performing a molding process, an encapsulant 12 is formed on the first carrier 10 so as to encapsulate the chip 11.

Figure 1C:
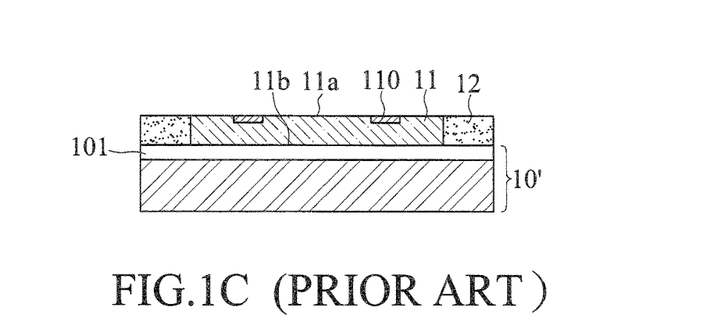

Referring to FIG. 1C, the first carrier 10 is removed, and a second carrier 10' is disposed on the inactive surface 11b of the chip 11 through a release layer 101 thereof.

Figure 1D:
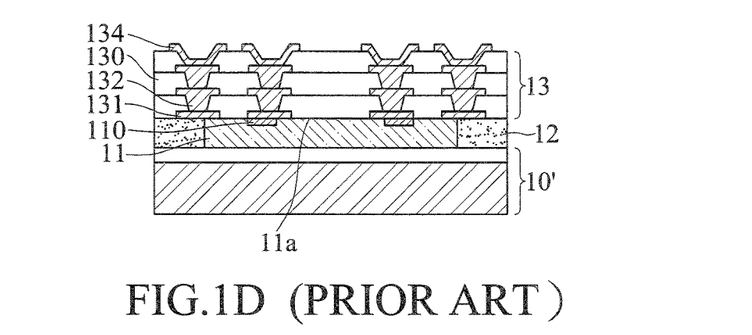

Referring to FIG. 1D, a circuit structure 13 is formed on the active surface 11a of the chip 11 and electrically connected to the electrode pads 110. The circuit structure 13 has at least a dielectric layer 130, a circuit layer 131 formed on the dielectric layer 130 and electrically connected to the electrode pads 110, and a plurality of conductive vias 132 formed in the dielectric layer 130 and electrically connected to the circuit layer 131. Further, a UBM (Under Bump Metallurgy) layer 134 is formed on the outermost circuit layer 131

Figure 1E:
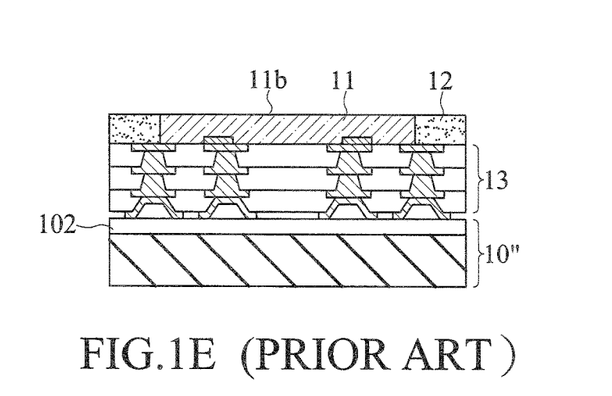

Referring to FIG. 1E, the second carrier 10' is removed, and a third carrier 10" is disposed on the circuit structure 13 through a release layer 102 thereof.

Figure 1F:
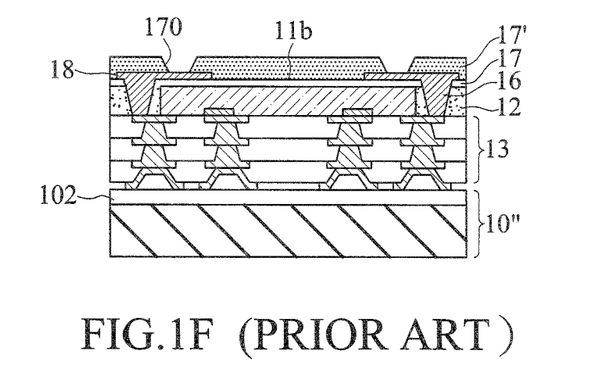

Referring to FIG. 1F, a dielectric layer 17 is formed on the encapsulant 12 and the inactive surface 11b of the chip 11. Then, a plurality of through holes are formed in the encapsulant 12 by laser and a plurality of conductors 16 are formed in the through holes of the encapsulant 12. Further, a circuit layer 18 is formed on the dielectric layer 17 and electrically connected to the conductors 16. Thereafter, an insulating layer 17' is formed on the dielectric layer 17 and has a plurality of openings 170 exposing portions of the circuit layer 18.

Figure 1G:
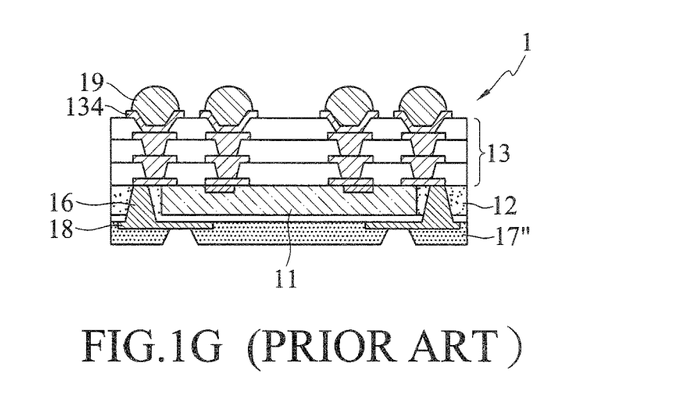

Referring to FIG. 1G, the third carrier 10" is removed, and a plurality of solder balls 19 are formed on the UBM layer 134.

However, in the above-described method of the package structure 1, the use of the first, second and third carriers 10, 10', 10" complicates the fabrication process and increases the material cost.

Further, since the first carrier 10 can only be removed after the encapsulant 12 is cured, the fabrication time and cost are increased.

Furthermore, after the first carrier 10 is removed, warpage easily occurs to the encapsulant 12, thus reducing the reliability of the package structure 1.

In addition, since the encapsulant 12 is made of a granular compound material, the through holes of the encapsulant 12 may be formed with uneven wall surfaces, thereby adversely affecting integrity of the conductors 16 and degrading the electrical performance.

Therefore, how to overcome the above-described drawbacks has become critical.

SUMMARY OF THE INVENTION

In view of the above-described drawbacks, the present invention provides a package structure, which comprises: a carrier having opposite first and second surfaces, wherein at least a recess is formed on the first surface of the carrier; at least an electronic element disposed in the recess of the carrier; an insulating layer formed in the recess to encapsulate the electronic element; a circuit structure formed on the first surface of the carrier and electrically connected to the electronic element; and a plurality of conductors formed in the carrier and communicating the first and second surfaces of the carrier, wherein the conductors are electrically connected to the circuit structure.

The present invention further provides a method for fabricating a package structure, which comprises the steps of: providing a carrier having opposite first and second surfaces, wherein at least a recess is formed on the first surface of the carrier; disposing at least an electronic element in the recess of the carrier; forming an insulating layer in the recess to encapsulate the electronic element, wherein the electronic element is exposed from the insulating layer; forming a circuit structure on the first surface of the carrier, wherein the circuit structure is electrically connected to the electronic element; forming a plurality of through holes penetrating the first and second surfaces of the carrier; and forming a conductive material in the through holes to form a plurality of conductors, wherein the conductors are electrically connected to the circuit structure.

In the above-described structure and method, the carrier can be a packaging substrate, a semiconductor chip, a wafer, an interposer or a packaged or unpackaged semiconductor element.

In the above-described structure and method, the electronic element can be exposed from the second surface of the carrier.

In the above-described structure and method, the electronic element can protrude above the first surface of the carrier.

In the above-described structure and method, the surface of the insulating layer can be flush with the surface of the electronic element.

In the above-described structure and method, the insulating layer can be made of a molding compound material, a dry film material, a built-up material or a photoresist material.

In the above-described structure and method, at least a dielectric layer can be formed on the second surface of the carrier, and a circuit layer can be formed on the dielectric layer and electrically connected to the conductors.

In the above-described structure and method, a plurality of conductive elements can be formed on the circuit structure.

In the above-described structure and method, another electronic element can be disposed on the second surface of the carrier and electrically connected to the conductors.

According to the present invention, a recess is formed in a carrier so as to receive an electronic element in the carrier. Therefore, the present invention uses the carrier as a substrate body, which is different from the prior art that uses an encapsulant as the substrate body. Therefore, the present invention dispenses with the conventional first carrier and the molding process for forming the encapsulant and hence simplifies the fabrication process and reduces the material cost. Further, the circuit structure is formed before formation of the through holes and the conductors so as to simplify the fabrication process and fixture.

Furthermore, by using the carrier as the substrate body, the prevent invention greatly reduces the time for forming the insulating layer and avoids warping of the package structure, thereby reducing the fabrication time and increasing the product reliability.

In addition, the through holes of the carrier are formed with smooth wall surfaces so as to ensure integrity of the conductors. As such, the product reliability is increased.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2G are schematic cross-sectional views showing a method for fabricating a package structure 2 according to the present invention.

Figure 2A:
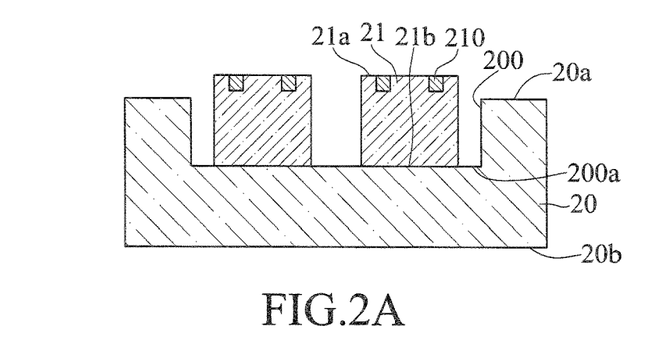
FIGS. 2A to 2G are schematic cross-sectional views showing a method for fabricating a package structure according to the present invention, wherein FIG. 2D' shows another embodiment of FIG. 2D, FIG. 2G' shows another embodiment of FIG. 2G, and FIG. 2G" shows a further embodiment of FIG. 2G that is consistent with FIG. 2D'.

Referring to FIG. 2A, a carrier 20 having opposite first and second surfaces 20a, 20b is provided and at least a recess 200 is formed on the first surface 20a of the carrier 20. Then, at least an electronic element 21 is disposed in the recess 200 of the carrier 20. The electronic element 21 has an active surface 21a with a plurality of electrode pads 210 and an inactive surface 21b opposite to the active surface 21a, and the electronic element 21 is bonded to a bottom surface 200a of the recess 200 via the inactive surface 21b thereof.

In the present embodiment, the carrier 20 is a packaging substrate, a semiconductor chip, a wafer, an interposer, or a packaged or unpackaged semiconductor element. For example, the carrier 20 shown in FIG. 2A is a silicon substrate.

The recess 200 is formed by dry etching.

The electronic element 21 is an active element such as a semiconductor chip, a passive element such as a resistor, a capacitor or an inductor, or a combination thereof.

Further, the electronic element 21 protrudes above the first surface 20a of the carrier 20. That is, the active surface 21a of the electronic element 21 is positioned higher than the first surface 20a of the carrier 20.

Figure 2B:
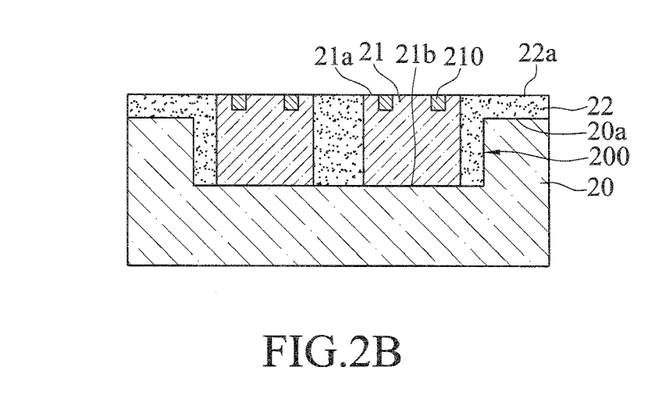

Referring to FIG. 2B, an insulating layer 22 is formed in the recess 200 to encapsulate the electronic element 21. The active surface 21a of the electronic element 21 is exposed from the insulating layer 22.

In the present embodiment, the insulating layer 22 is further formed on the first surface 20a of the carrier 20, and the surface 22a of the insulating layer 22 is flush with the active surface 21a of the electronic element 21.

Further, the insulating layer 22 is made of a molding compound material, a dry film material, a built-up material or a photoresist material. For example, the dry film material can be formed by lamination, and the photoresist material can be formed by spray coating or sputtering.

Figure 2C:
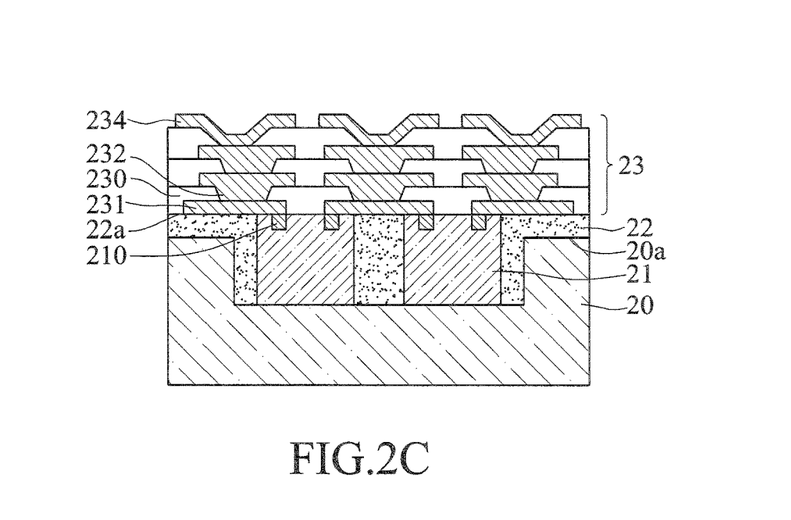

Referring to FIG. 2C, an RDL (redistribution layer) process is performed to form a circuit structure 23 on the first surface 20a of the carrier 20, i.e., on the surface 22a of the insulating layer 22 and the active surface 21a of the electronic element 21. The circuit structure 23 is electrically connected to the electronic element 21.

In the present embodiment, the circuit structure 23 has at least a dielectric layer 230, a circuit layer 231 formed on the dielectric layer 230, and a plurality of conductive vias 232 formed in the dielectric layer 230 and electrically connected to the circuit layer 231. The circuit layer 231 is electrically connected to the electrode pads 210 of the electronic element 21. Further, a UBM layer 234 is formed on the outermost circuit layer 231 for mounting external elements in subsequent processes.

Figure 2D:
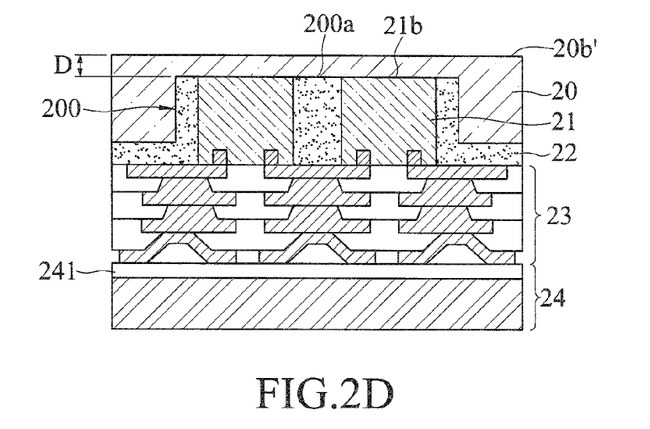

Referring to FIG. 2D, a carrier 24 is disposed on the circuit structure 23 via a release layer 241 thereof. Then, the overall structure is turned upside down. Thereafter, a grinding process is performed on the second surface 20b of the carrier 20 so as to form a second surface 20b'. As such, a short distance D is achieved between the second surface 20b' of the carrier 20 and the inactive surface 21b of the electronic element 21.

In the present embodiment, the carrier 24 is a silicon or glass substrate.

In another embodiment, referring to FIG. 2D', the second surface 20b" of the carrier 20 is flush with the inactive surface 21b of the electronic element 21 so as to expose the electronic element 21 from the second surface 20b" of the carrier 20. In particular, in the process of FIG. 2A, the recess 200 is formed to penetrate the first and second surfaces 20a, 20b, and then the electronic element 21 is disposed in the recess 200. Alternatively, after the process of FIG. 2B or FIG. 2D, the carrier 20 is partially removed from the second surface 20b to form the second surface 20b" exposing the electronic element 21.

Figure 2E:
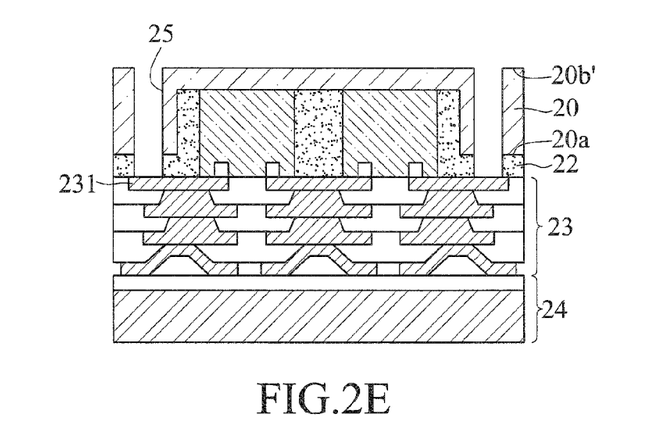

Referring to FIG. 2E, a TSV (Through Silicon Via) process is performed on the second surface 20b' of the carrier 20 so as to form a plurality of through holes 25 penetrating the first surface 20a and the second surface 20b' of the carrier 20.

In the present embodiment, the through holes 25 are formed by dry etching. Further, the through holes 25 extend into the insulating layer 22 so as to expose portions of the circuit layer 231.

Figure 2F:
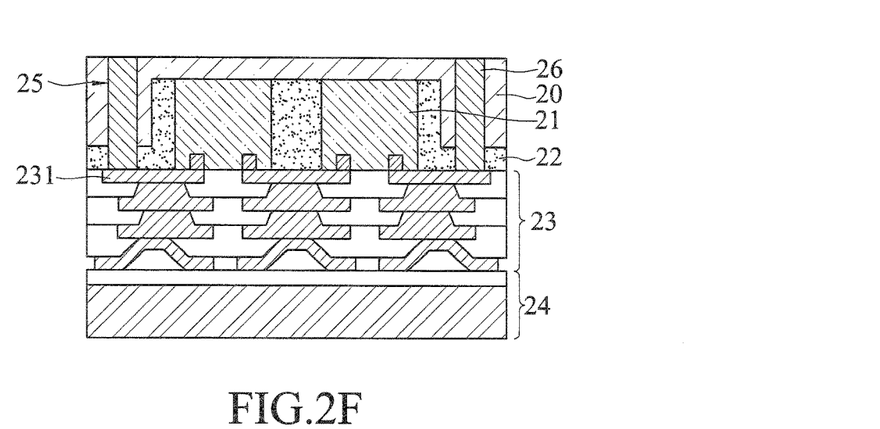

Referring to FIG. 2F, a conductive material is formed in the through holes 25 to form a plurality of conductors 26. The conductors 26 are electrically connected to the circuit layer 231 of the circuit structure 23.

In the present embodiment, the conductors 26 have a column shape.

In the present method, the circuit structure 23 is formed before formation of the through holes 25 and the conductors 26 so as to simplify the fabrication process and fixture.

Figure 2G:
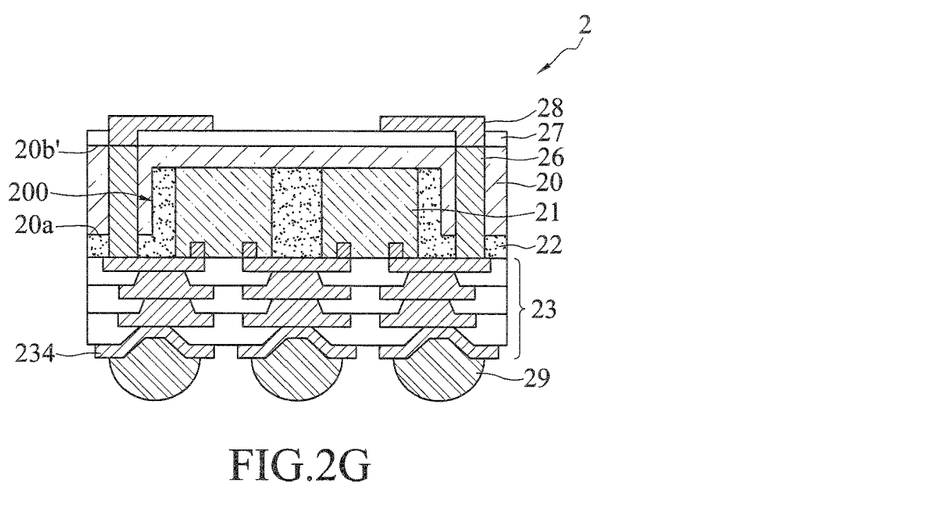

Referring to FIG. 2G an RDL process is performed to form a dielectric layer 27 such as an oxide layer on the second surface 20b' of the carrier 20. Then, a circuit layer 28 is formed on the dielectric layer 27 and electrically connected to the conductors 26.

Subsequently, the carrier 24 is removed, and a plurality of conductive elements 29 such as solder or metal bumps are formed on the UBM layer 234 of the circuit structure 23.

It should be noted that the number of the dielectric layer 27 and the circuit layer 28 can be varied according to the practical need.

In another embodiment, the active surface 21a of the electronic element 21 does not protrude above the first surface 20a of the carrier 20. For example, the active surface 21a of the electronic element 21 is flush with the first surface 20a of the carrier 20 and the surface 22a of the insulating layer 22, as shown in FIG. 2G'.

According to the present invention, the recess 200 is formed in the carrier 20 so as to receive the electronic element 21 in the carrier 20. Therefore, the present invention uses the carrier 20 instead of the conventional encapsulant as a substrate body. Accordingly, the present invention dispenses with the conventional first carrier and the molding process for forming the encapsulant and thereby simplifies the fabrication process and reduces the material cost.

Further, if the insulating layer 22 is made of a dry film material or a photoresist material, the present invention can directly perform subsequent processes without the need to wait until the insulating layer 22 is cured, thus reducing the fabrication time and cost. If the insulating layer 22 is made of a liquid molding compound material, since the carrier 20 is used as the substrate body, the volume of the insulating layer 22 is far less than that of the conventional encapsulant, thus reducing the fabrication time.

Furthermore, by using the carrier 20 as the substrate body, the present invention avoids warping of the package structure and therefore strengthens the package structure 2 and increases the product reliability.

In addition, the through holes 25 of the carrier 20 are formed with smooth wall surfaces so as to cause vertical conductive circuits, i.e., the conductors 16, to be formed with preferred structures. As such, the product reliability is increased.

Figure 3:
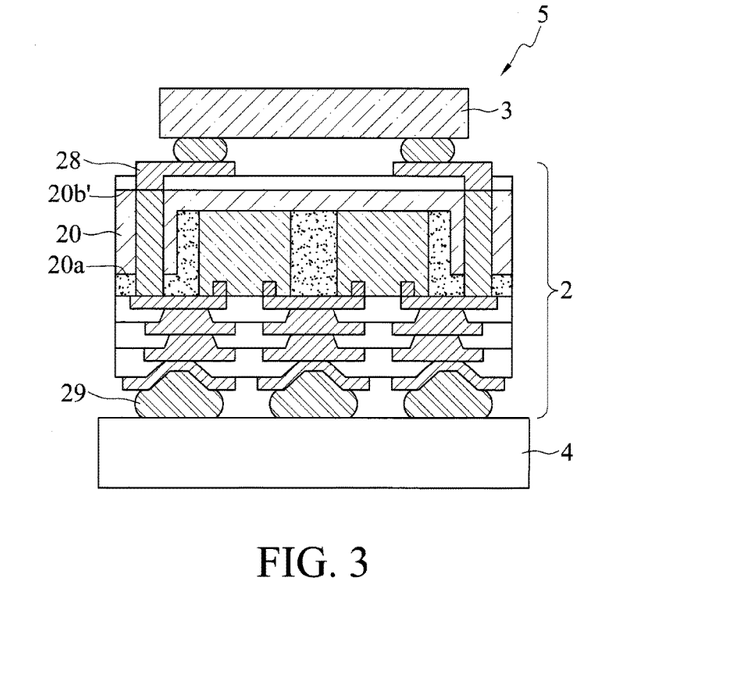
FIG. 3 is a schematic cross-sectional view showing processes performed after the process of FIG. 2G

Subsequently, referring to FIG. 3, an electronic element 3 is disposed on the circuit layer 28 on the second surface 20b' of the carrier 20 and electrically connected to the conductors 26 through the circuit layer 28. Further, the package structure 2 is disposed on an electronic device 4 such as a circuit board through the conductive elements 29. As such, a PoP structure 5 is obtained.

In the present embodiment, the electronic element 3 is an active element such as a semiconductor chip, a passive element such as a resistor, a capacitor or an inductor, or a combination thereof.

The present invention further provides a package structure 2, which has: a carrier 20 having opposite first and second surfaces 20a, 20b', wherein at least a recess 200 is formed on the first surface 20a of the carrier 20; at least an electronic element 21 disposed in the recess 200 of the carrier 20; an insulating layer 22 formed in the recess 200 to encapsulate the electronic element 21; a circuit structure 23 formed on the first surface 20a of the carrier 20 and electrically connected to the electronic element 21; and a plurality of conductors 26 formed in the carrier 20 and communicating the first and second surfaces 20a, 20b' of the carrier 20, wherein the conductors 26 are electrically connected to the circuit structure 23.

The carrier 20 can be a packaging substrate, a semiconductor chip, a wafer, an interposer, or a packaged or unpackaged semiconductor element.

The insulating layer 22 can be made of a molding compound material, a dry film material, a built-up material or a photoresist material.

In an embodiment, the electronic element 21 is exposed from the second surface 20b" of the carrier 20, as shown in FIG. 2D'.

In an embodiment, the electronic element 21 protrudes above the first surface 20a of the carrier 20.

In an embodiment, the surface 22a of the insulating layer 22 is flush with the surface 21a of the electronic element 21.

In an embodiment, the package structure 2 further has a dielectric layer 27 formed on the second surface 20b' of the carrier 20, and a circuit layer 28 formed on the dielectric layer 27 and electrically connected to the conductors 26.

In an embodiment, the package structure 2 further has a plurality of conductive elements 29 formed on the circuit structure 23.

In an embodiment, the package structure 2 further has another electronic element 3 disposed on the second surface 20b' of the carrier 20 and electrically connected to the conductors 26.

Therefore, the present invention replaces the conventional encapsulant with a carrier so as to simplify the fabrication process, reduce the fabrication time and cost and avoid warping of the package structure.

Further, the through holes are formed in the carrier with smooth wall surfaces so as to increase the product reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
   a carrier having opposite first and second surfaces, wherein at least a recess is formed on the first surface of the carrier;
   at least an electronic element disposed in the recess of the carrier;
   an insulating layer formed in the recess to encapsulate the electronic element and on the first surface of the carrier to cover the first surface, with a plurality of through holes penetrating the first and second surfaces of the carrier and the insulating layer, wherein the insulating layer is made of a material different from a material of the carrier;

a circuit structure formed on the first surface of the carrier and electrically connected to the electronic element; and a plurality of conductors formed in the through holes, wherein the conductors are conductive columns and penetrate the first and second surfaces of the carrier and the insulating layer and are electrically connected to the circuit structure.

2. The structure of claim 1, wherein the carrier is a packaged or unpackaged semiconductor element.

3. The structure of claim 1, wherein the carrier is a packaging substrate, a semiconductor chip, a wafer or an interposer.

4. The structure of claim 1, wherein the electronic element is exposed from the second surface of the carrier.

5. The structure of claim 1, wherein the electronic element protrudes above the first surface of the carrier.

6. The structure of claim 1, wherein a surface of the insulating layer is flush with a surface of the electronic element.

7. The structure of claim 1, wherein the insulating layer is made of a molding compound material, a dry film material, a built-up material or a photoresist material.

8. The structure of claim 1, further comprising at least a dielectric layer formed on the second surface of the carrier, and a circuit layer formed on the dielectric layer and electrically connected to the conductors.

9. The structure of claim 1, further comprising a plurality of conductive elements formed on the circuit structure.

10. The structure of claim 1, further comprising another electronic element disposed on the second surface of the carrier and electrically connected to the conductors.

11. A method for fabricating a package structure, comprising the steps of:

providing a carrier having opposite first and second surfaces, wherein at least a recess is formed on the first surface of the carrier;

disposing at least an electronic element in the recess of the carrier;

forming an insulating layer in the recess to encapsulate the electronic element and on the first surface of the carrier to cover the first surface, wherein the electronic element is exposed from the insulating layer, and the insulating layer is made of a material different from a material of the carrier;

forming a circuit structure on the first surface of the carrier, wherein the circuit structure is electrically connected to the electronic element;

forming a plurality of through holes penetrating the first and second surfaces of the carrier and the insulating layer; and forming a conductive material in the through holes to form a plurality of conductors, wherein the conductors are conductive columns and penetrate the first and second surfaces of the carrier and the insulating layer and are electrically connected to the circuit structure.

12. The method of claim 11, wherein the carrier is a packaged or unpackaged semiconductor element.

13. The method of claim 11, wherein the carrier is a packaging substrate, a semiconductor chip, a wafer or an interposer.

14. The method of claim 11, wherein the electronic element is exposed from the second surface of the carrier.

15. The method of claim 11, wherein the electronic element protrudes above the first surface of the carrier.

16. The method of claim 11, wherein a surface of the insulating layer is flush with a surface of the electronic element.

17. The method of claim 11, wherein the insulating layer is made of a molding compound material, a dry film material, a built-up material or a photoresist material.

18. The method of claim 11, further comprising forming at least a dielectric layer on the second surface of the carrier, and forming a circuit layer on the dielectric layer, wherein the circuit layer is electrically connected to the conductors.

19. The method of claim 11, further comprising forming a plurality of conductive elements on the circuit structure.

20. The method of claim 11, further comprising disposing another electronic element on the second surface of the carrier, wherein said another electronic element is electrically connected to the conductors.

* * * * *